(12) United States Patent
Zhang et al.

(10) Patent No.: US 11,749,194 B2
(45) Date of Patent: Sep. 5, 2023

(54) DISPLAY SUBSTRATE, DRIVING METHOD THEREFOR, AND DISPLAY DEVICE

(71) Applicant: BOE Technology Group Co., Ltd., Beijing (CN)

(72) Inventors: Can Zhang, Beijing (CN); Ning Cong, Beijing (CN); Minghua Xuan, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/787,681

(22) PCT Filed: Sep. 1, 2021

(86) PCT No.: PCT/CN2021/115885
§ 371 (c)(1),
(2) Date: Jun. 21, 2022

(87) PCT Pub. No.: WO2022/083302
PCT Pub. Date: Apr. 28, 2022

(65) Prior Publication Data
US 2023/0010646 A1    Jan. 12, 2023

(30) Foreign Application Priority Data

Oct. 21, 2020    (CN) .......................... 202011134742.5

(51) Int. Cl.
*G09G 3/3233*    (2016.01)
*G09G 3/20*    (2006.01)

(52) U.S. Cl.
CPC ......... *G09G 3/3233* (2013.01); *G09G 3/2007* (2013.01); *G09G 2300/0426* (2013.01);
(Continued)

(58) Field of Classification Search
CPC ............. H10K 59/121; H10K 59/1213; H10K 59/131; G09G 3/3233; G09G 3/2007;
(Continued)

(56) References Cited

U.S. PATENT DOCUMENTS 9,245,931 B2 *  1/2016  Cho ...................... H10K 85/30
9,842,887 B2 * 12/2017  Sato ..................... H10K 59/131
(Continued)

FOREIGN PATENT DOCUMENTS

CN    101147185 A    3/2008
CN    102005170 A    4/2011
(Continued)

OTHER PUBLICATIONS

CN20201 1134742.5 first office action.
CN20201 1134742.5 second office action.
CN20201 1134742.5 Decision of Rejection.

*Primary Examiner* — David Tung
(74) *Attorney, Agent, or Firm* — IPRO, PLLC

(57) ABSTRACT

A display substrate, a driving method therefor, and a display device are provided. The display substrate includes: a base substrate, provided with multiple pixel islands discretely provided, the pixel islands including multiple subpixels distributed in an array; a plurality of pixel circuits, arranged in the subpixels respectively, each of the pixel circuits including a driving transistor and a light-emitting component, a first electrode of the driving transistor being electrically connected to a first power supply end, a second electrode of the driving transistor being electrically connected to an anode of the light-emitting component, and a cathode of the light-emitting component being electrically connected to a second power supply end; and multiple light emission control circuits, each arranged at a gap between adjacent pixel islands, the light emission control circuit (Continued)

being electrically connected between the first power supply end and the first electrode of the driving transistor.

14 Claims, 3 Drawing Sheets

(52) U.S. Cl.
CPC ............ *G09G 2300/0452* (2013.01); *G09G 2300/0465* (2013.01); *G09G 2300/0819* (2013.01); *G09G 2300/0842* (2013.01); *G09G 2300/0861* (2013.01); *G09G 2310/08* (2013.01); *G09G 2330/02* (2013.01)

(58) Field of Classification Search
CPC ......... G09G 3/3225; G09G 2300/0426; G09G 2300/0452; G09G 2300/0465; G09G 2300/0819; G09G 2300/0842; G09G 2300/0861; G09G 2310/08; G09G 2320/0295; G09G 2330/02
See application file for complete search history.

(56) References Cited

U.S. PATENT DOCUMENTS

| | | | | |
|---|---|---|---|---|
| 10,437,109 B2* | 10/2019 | Kim | ............. | G02F 1/1368 |
| 11,170,699 B2* | 11/2021 | Wu | ............. | G09G 3/3413 |
| 2005/0017930 A1* | 1/2005 | Kobayashi | ............. | G09G 3/3208 345/76 |
| 2005/0243038 A1* | 11/2005 | Kwak | ............. | G09G 3/3208 345/76 |
| 2006/0164345 A1 | 7/2006 | Sarma et al. | | |
| 2011/0043500 A1* | 2/2011 | Kwak | ............. | G09G 3/006 345/206 |
| 2011/0050761 A1 | 3/2011 | Yoneyama | | |
| 2013/0208017 A1* | 8/2013 | Gu | ............. | G09G 3/003 345/690 |
| 2013/0328753 A1* | 12/2013 | Tsuge | ............. | G09G 3/3233 345/77 |
| 2015/0062195 A1 | 3/2015 | Kumeta et al. | | |
| 2016/0300532 A1* | 10/2016 | Tan | ............. | G09G 3/3291 |
| 2019/0012948 A1* | 1/2019 | Ohara | ............. | G09G 3/3258 |
| 2019/0311674 A1 | 10/2019 | Shin et al. | | |
| 2021/0233968 A1* | 7/2021 | Yang | ............. | H10K 59/353 |

FOREIGN PATENT DOCUMENTS

| | | |
|---|---|---|
| CN | 108010489 A | 5/2018 |
| CN | 108417178 A | 8/2018 |
| CN | 109036279 A | 12/2018 |
| CN | 110853573 A | 2/2020 |
| CN | 111462680 A | 7/2020 |
| CN | 111613660 A | 9/2020 |
| CN | 112233620 A | 1/2021 |

* cited by examiner

DISPLAY SUBSTRATE, DRIVING METHOD THEREFOR, AND DISPLAY DEVICE

CROSS REFERENCE TO RELATED APPLICATION

This application is a national phase entry under 35 U.S.C § 371 of International Application No. PCT/CN2021/115885, filed Sep. 1, 2021, which claims the priority to Chinese Patent Application No. 202011134742.5, filed to China National Intellectual Property Administration on Oct. 21, 2020 and entitled "Display Substrate, Driving Method therefor, and Display Device", which is incorporated in its entirety herein by reference.

FIELD

The present disclosure relates to the field of display, in particular to a display substrate, a driving method therefor, and a display device.

BACKGROUND

With the advantages of self-luminescence, wide angle of view, high response speed, etc., the organic light emitting diode (OLED) has been widely used in the display field.

SUMMARY

A display substrate provided in the embodiments of the present disclosure includes:

a base substrate, provided with a plurality of pixel islands discretely arranged, each of the plurality of pixel islands including a plurality of subpixels distributed in an array;

a plurality of pixel circuits arranged in the plurality of subpixels, each of the plurality of pixel circuits including a driving transistor and a light-emitting device, a first electrode of the driving transistor is electrically connected to a first power supply end, a second electrode of the driving transistor is electrically connected to an anode of the light-emitting device, and a cathode of the light-emitting device is electrically connected to a second power supply end; and a plurality of light emission control circuits, each arranged at a gap between two adjacent pixel islands, the light emission control circuit is being electrically connected between the first power supply end and the first electrode of the driving transistor.

Optionally, in the display substrate provided in the embodiments of the present disclosure, first electrodes of all driving transistors in at least one pixel island are electrically connected to one light emission control circuit, and first electrodes of driving transistors in different pixel islands are electrically connected to different light emission control circuits.

Optionally, in the display substrate provided in the embodiments of the present disclosure, the light emission control circuit includes a first switch transistor, a gate electrode of the first switch transistor is electrically connected to a light emission control end, a first electrode of the first switch transistor is electrically connected to a first power supply end, and a second electrode of the first switch transistor is electrically connected to the first electrodes of the driving transistors.

Optionally, in the display substrate provided in the embodiments of the present disclosure, the display substrate further includes a plurality of resistors, each of the plurality of resistors is arranged at a gap between adjacent pixel island; a first end of the resistor is electrically connected to the anode of the light-emitting device, and s second end of the resistor is grounded.

Optionally, in the display substrate provided in the embodiments of the present disclosure, anodes of all light-emitting devices in at least one pixel island are electrically connected to one resistor, and anodes of light-emitting devices in different pixel islands are electrically connected to different resistors.

Optionally, in the display substrate provided in the embodiments of the present disclosure, a resistance of the resistor is greater than 10 KΩ.

Optionally, in the display substrate provided in the embodiments of the present disclosure, a width of the gap between the two adjacent pixel islands ranges from 10 μm to 30 μm.

Optionally, in the display substrate provided in the embodiments of the present disclosure, each of the plurality of pixel circuits further includes: a second switch transistor, a third switch transistor, and a capacitor;

a gate electrode of the second switch transistor is electrically connected to a scanning control end, a first electrode of the second switch transistor is electrically connected to a data signal end, and a second electrode of the second switch transistor is electrically connected to the gate electrode of the driving transistor;

a gate electrode of the third switch transistor is electrically connected to a detection control end, a first electrode of the third switch transistor is electrically connected to a detection signal end, and a second electrode of the third switch transistor is electrically connected to the anode of the light-emitting device; and the capacitor is electrically connected between the gate electrode and the first electrode of the driving transistor.

Optionally, in the display substrate provided in the embodiments of the present disclosure, the display substrate further includes a plurality of sensing lines, where detection signal ends of one column of subpixels are electrically connected to one sensing line, and detection signal ends of different columns of subpixels are electrically connected to different sensing lines.

Optionally, in the display substrate provided in the embodiments of the present disclosure, light colors of light-emitting device in one pixel island are identical.

Optionally, in the display substrate provided in the embodiments of the present disclosure, the plurality of pixel islands are distributed in an array, and the plurality of pixel islands include a plurality of first pixel islands for displaying red, a plurality of second pixel islands for displaying green, and a plurality of third pixel islands for displaying blue.

Correspondingly, the embodiments of the present disclosure further provide a display device. The display device includes the display substrate provided in the embodiments of the present disclosure.

Correspondingly, the embodiments of the present disclosure further provide a driving method for the display substrate provided in the embodiments of the present disclosure. The driving method includes:

initializing a driving transistor and a light-emitting device in the pixel circuit in a resetting stage;

writing a data signal and a threshold voltage of the driving transistor to a control electrode of the driving transistor in a data write stage; and controlling the driving transistor to drive the light-emitting device to emit light in a light-emitting stage.

Optionally, in the driving method provided in the embodiments of the present disclosure, in the light-emitting stage, when it is determined that a light gray scale of the light-emitting device is a preset gray scale, a voltage of the first power supply end is fixed, and display at different gray scales is achieved by adjusting a duty ratio of the first switch transistor.

DETAILED DESCRIPTION OF THE EMBODIMENTS

Figure 1:
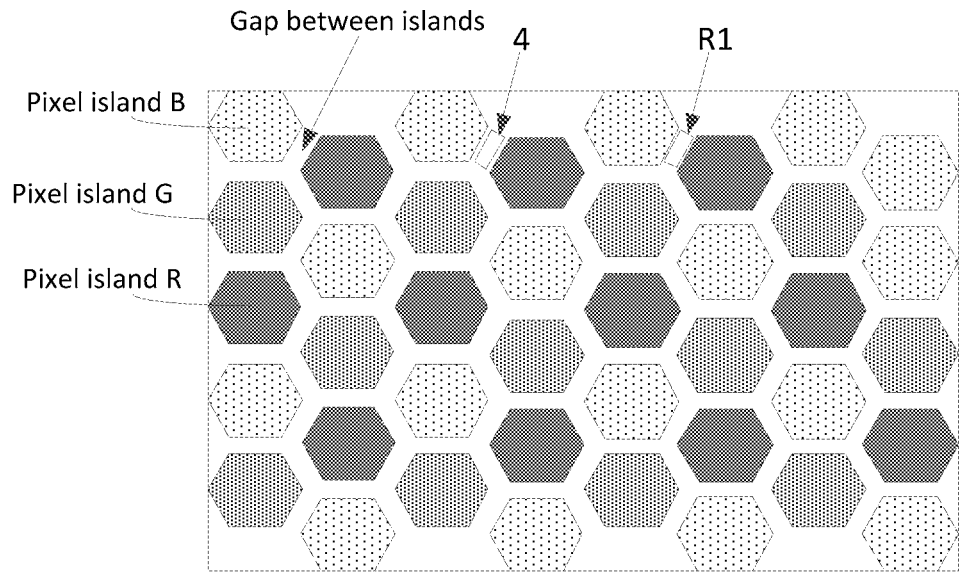
FIG. 1 is a structural schematic diagram of a top view of a display panel provided in an embodiment of the present disclosure.

For making the objectives, technical solutions and advantages of embodiments of the present disclosure more obvious, the technical solutions of the embodiments of the present disclosure will be clearly and completely described below in conjunction with the accompanying drawings in the embodiments of the present disclosure. Apparently, the embodiments described are some embodiments rather than all embodiments of the present disclosure. Furthermore, the embodiments in the present disclosure and features in the embodiments may be combined without conflicts. Based on the described embodiments of the present disclosure, all other embodiments acquired by those skilled in the art without making creative efforts fall within the scope of protection of the present disclosure.

Unless otherwise defined, technical or scientific terms used in the present disclosure are to be given their ordinary meaning as understood by those of ordinary skill in the art to which the present disclosure belongs. As used in the present disclosure, words such as "comprise" or "include" mean that elements or items appearing before the word encompass elements or items listed after the word and equivalents thereof, but do not exclude other elements or items. "Connect" or "connected" and like words are not restricted to physical or mechanical connections, but may include electrical connections, whether direct or indirect. "Inner", "outer", "upper", "lower", etc. are merely used to indicate a relative positional relation, and when an absolute position of the described object is changed, the relative positional relation may also be changed accordingly.

It is noted that sizes and shapes of graphs in the drawings do not reflect true scale, and are merely illustrative of the present disclosure. Furthermore, same or similar reference numerals refer to the same or similar elements or elements having the same or similar function throughout.

Currently, a display substrate with a pixel island may be generally used in a virtual reality (VR) display device, or an augmented reality (AR) display device. As an example of a VR display device, a plurality of micro lenses may also be arranged in the display device, and light rays with different colors emitted by all pixel island areas may be displayed on a real image plane by means of the micro lenses, so as to complete display.

A VR or AR display device with a pixel island may achieve retina display, for example, 300 PPI, which may be converted to 60 pixels per degree (PPD). Under the condition that a field angle is 120 degrees when two eyes of a user overlap, the number of pixels needed by a single eye needs to reach 7200*7200, that is, 7200 pixels set in each row, and 7200 pixels set in each column. Assuming that a light-emitting device in a pixel is a silicon-based organic light emitting diode (OLED), that is, made of a silicon-based material, a silicon-based OLED display substrate generally has a size of less than or equal to 1.5 inch due to the influence of cost and process, thereby putting higher requirements on a pixel per inch (PPI) of a display substrate.

In order to satisfy the requirement for high PPI, the silicon-based OLED uses a simple pixel circuit driving mode as much as possible to ensure a minimum number of Metal-Oxide-Semiconductor Field-Effect Transistor (MOS), and the size of the MOS need to be as small as possible. Reduction of the number and the size of the MOS brings a series of problems, for example, a threshold voltage Vth uniformity problem of the MOS, a threshold voltage Vth offset problem caused by fatigue of the MOS, etc., such that a 3 transistor-1 capacitor (3T1C) pixel circuit solution with an external compensation function is generally used in a pixel circuit.

The silicon-based OLED has a smaller pixel and therefore requires a smaller current, typically from a few tens of PA to a few tens of nA, and as for a novel pixel island display mode, a red green blue (RGB)-evaporated OLED light-emitting device is required instead of a conventional white organic light-emitting diode (WOLED) light-emitting device, such that the silicon-based OLED requires smaller currents, typically from 0.1 PA to several nA. But as for a 3T1C pixel circuit, this may make it difficult for the silicon-based OLED to achieve low-gray-scale display. Therefore, it is necessary to provide a solution to solve the problem of difficulty in low-gray-scale display while achieving high PPI.

Figure 2:
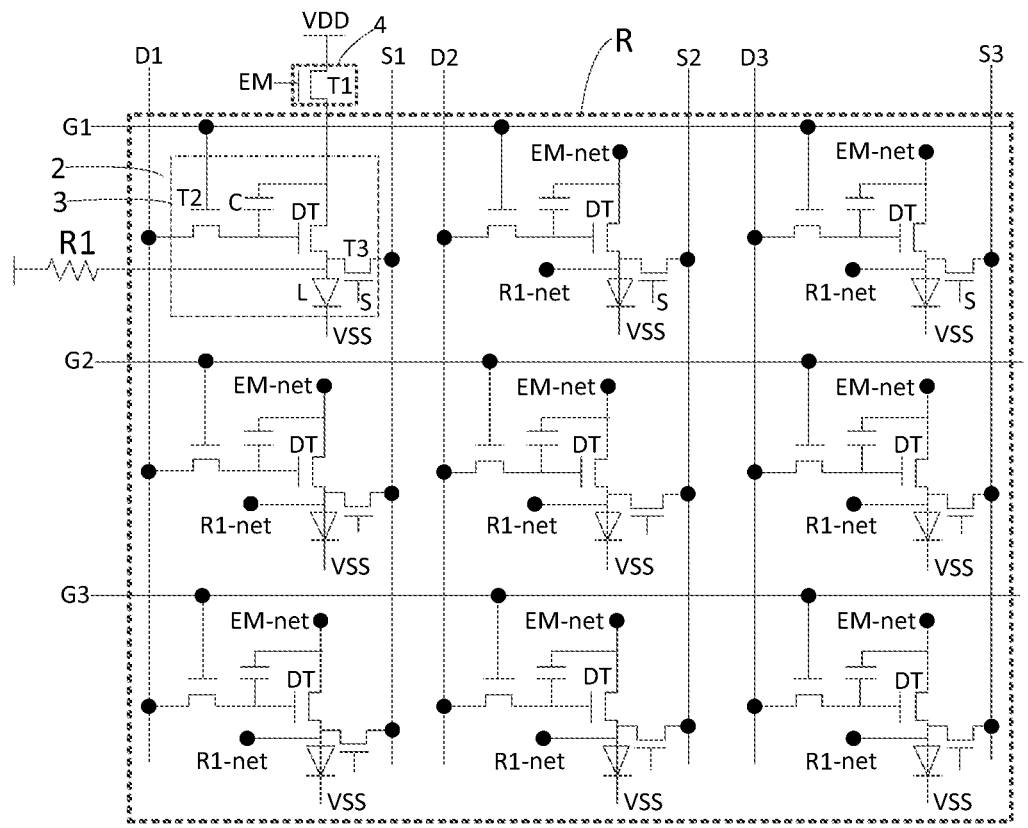
FIG. 2 is a structural schematic diagram of a pixel island in a display substrate provided in an embodiment of the present disclosure.

In view of this, the embodiments of the present disclosure provide a display substrate. As shown in FIGS. 1 and 2, FIG. 1 is a schematic diagram of a top view structure of the display substrate, FIG. 2 is another schematic structural diagram of the display substrate as an example of a pixel island, and the display substrate may include:

a base substrate 1 provided with a plurality of pixel islands (for example, a pixel island R, a pixel island G and a pixel island B) discretely arranged, the pixel islands (for example, the pixel island R as shown in FIG. 2) including a plurality of subpixels 2 distributed in an array, where in the embodiments of the present disclosure, each pixel island including a plurality of subpixels 2 distributed in an array;

a plurality of pixel circuits 3 arranged in the plurality of subpixels 2 respectively, where each of the plurality of pixel circuits 3 includes a driving transistor DT and a light-emitting device L, a first electrode of the driving transistor DT is electrically connected to a first power supply end VDD, a second electrode of the driving transistor DT is electrically connected to an anode of the light-emitting device L, and a cathode of the light-emitting device L is electrically connected to a second power supply end VSS; and a plurality of light emission control circuits 4, each arranged at a gap between two adjacent pixel islands (as shown in FIG. 1, arranged between the pixel islands R and B; and as shown in FIG. 2, arranged outside the pixel island R), the light emission control circuit 4 being electrically connected between the first power supply end VDD and the first electrode of the driving transistor DT.

According to the display substrate provided in the embodiments of the present disclosure, a pixel island driving mode is used, such that a silicon-based OLED may be ensured to achieve high PPI. In addition, by additionally arranging a light emission control circuit 4 electrically connected between a first power supply end VDD and a first electrode of the driving transistor DT, when a low-gray-scale picture is displayed, a corresponding maximum VDD voltage in a low gray scale may be fixed, and different low-gray-scale display is achieved by controlling a starting duration (a pulse width modulation (pwm) method) of the light emission control circuit 4, such that the problem that low-gray-scale display is difficult due to small pixel current of the silicon-based OLED may be solved. Moreover, the light emission control circuit 4 added in the present disclosure is arranged at a gap between two adjacent pixel islands, such that an area of an original subpixel is not increased, a larger number of subpixels may be arranged in the pixel islands, which lays a foundation for high PPI. Therefore, the embodiments of the present disclosure may solve the problems of low pixel current and difficulty in low-gray-scale display of an existing silicon-based OLED on the basis of achieving high PPI.

During specific implementation, in the display substrate provided in the embodiments of the present disclosure, first electrodes of all driving transistors in at least one pixel island are electrically connected to a same light emission control circuit. Specifically, as shown in FIG. 2, as an example of the pixel island R which includes nine subpixels 2, first electrodes of driving transistors DT in the nine subpixels 2 are electrically connected to one light emission control circuit 4, only the first electrode of the driving transistor DT in the first subpixel 2 at the upper left corner is shown to be electrically connected to the light emission control circuit 4, the first electrodes (EM-net) of the driving transistors DT in the remaining eight subpixels 2 are not shown to be connected to the light emission control circuit 4, however, during actual manufacturing, the first electrodes of all the driving transistors DT in the pixel island R are electrically connected to the light emission control circuit 4, that is, all the subpixels in one pixel island share one light emission control circuit 4. Specifically, in the embodiments of the present disclosure, the first electrodes of all the driving transistors DT in each pixel island (R, G, B) are electrically connected to one light emission control circuit 4.

First electrodes of driving transistors in different pixel islands are electrically connected to different light emission control circuits. Specifically, as shown in FIG. 1, for example, the pixel island R, the pixel island G and the pixel island B, a light emission control circuit electrically connected to the first electrodes of the driving transistors in the pixel island R, a light emission control circuit electrically connected to the first electrodes of the driving transistors in the pixel island G and a light emission control circuit electrically connected to the first electrodes of the driving transistors in the pixel island B are different control circuits, that is, the pixel islands in FIG. 1 correspond to different light emission control circuits, in this way, a time sequence during low-gray-scale display may be adjusted by taking the pixel island as a unit, and the problem of difficulty in low-gray-scale display is solved.

During specific implementation, in the display substrate provided in the embodiments of the present disclosure. As shown in FIG. 2, the light emission control circuit 4 may include a first switch transistor T1, a gate electrode of the first switch transistor T1 is electrically connected to a light emission control end EM, a first electrode of the first switch transistor T1 is electrically connected to the first power supply end VDD, and a second electrode of the first switch transistor T1 is electrically connected to the first electrode of the driving transistor DT. Specifically, a pixel includes 256 gray scales with a range of 0-255, for example, 0-50 are low gray scales, display at different gray scales corresponds to different driving voltages, the smaller the gray scale is, the smaller the driving voltage is, since the silicon-based OLED needs particularly small pixel current generally ranging from 0.1 PA to several nA, different low-gray-scale display is difficult to achieve by changing the driving voltage of the first power supply end VDD, such that by adding the first switch transistor T1, the first switch transistor T1 is turned on under control of an EM signal of the light emission control end in the light-emitting stage during low-gray-scale display, a driving voltage corresponding to the maximum gray scale 50 in 0-50 low gray scales is fixed, display at different gray scales in the low gray scales is achieved by adjusting the turn-on duration of the first switch transistor T1, and the longer the turn-on duration is, the larger the corresponding gray scale is.

During specific implementation, in a novel display manner using a pixel island driving mode, the current required by the silicon-based OLED is very small, the current from L0 to L255 gray scale has a range of 0.1 PA-5 nA, which exceeds driving capability of an MOS in the silicon-based OLED, off-state current Ioff of a common complementary metal oxide semiconductor (COMS) is in the order of magnitude of $E^{-13}$ to $E^{-12}$ and is greater than the current required by the silicon-based OLED, and then the off-state current Ioff may turn an OLED device on, such that on-state current Ion of the COMS is larger, even if the light emission control circuit is additionally arranged, it may not be guaranteed that the current flowing into the light-emitting device is in an expected current range, that is, the current, corresponding to the low gray scale, flowing into the light-emitting device is larger and is not beneficial to low-gray-scale display, such that performance such as a contrast ratio of the display panel is reduced. Therefore, in the display substrate provided in the embodiments of the present disclosure, as shown in FIGS. 1 and 2, the display substrate further includes a plurality of resistors R1, each of the plurality of resistors R1 is arranged at a gap between the two adjacent pixel islands; and a first end of the resistor R1 is electrically connected to the anode of the light-emitting device L, and a second end of the resistor R1 is grounded.

The resistor R1 is additionally arranged at the a gap between the two adjacent pixel islands, and the resistor R1 may form a shunt circuit, so as to guarantee the current flowing into the light-emitting device L to be within a normal range, that is, to further solve the problem that low-gray-scale display is difficult, and to improve a display contrast ratio.

During specific implementation, in the display substrate provided in the embodiments of the present disclosure, anodes of all light-emitting devices in at least one pixel island are electrically connected to one resistor. Specifically, as shown in FIG. 2, as an example of the pixel island R which includes nine subpixels 2, anodes of light-emitting devices L in the nine subpixels 2 are electrically connected to one resistor R1, only the anode of the light-emitting device L in the first subpixel 2 at the upper left corner is shown to be electrically connected to the resistor R1 in FIG.

2, the anodes (VR-net) of the light-emitting devices L in the remaining eight subpixels 2 are not shown to be connected to the resistor R1, however, during actual manufacturing, the anodes of all the light-emitting devices L in the pixel island R are electrically connected to the resistor R1, that is, all the subpixels in one pixel island share one light resistor R1. Specifically, in the embodiments of the present disclosure, the anodes of all the light-emitting devices L in each pixel island (R, G, or B) are electrically connected to one resistor R1.

Anodes of light-emitting devices in different pixel islands are electrically connected to different resistors. Specifically, as shown in FIG. 1, for example, the pixel island R, the pixel island G and the pixel island B, a resistor electrically connected to the anode of the light-emitting device in the pixel island R, a resistor electrically connected to the anode of the light-emitting device in the pixel island G and a resistor electrically connected to the anode of the light-emitting device in the pixel island B are different resistors, that is, the pixel islands in FIG. 1 correspond to different resistors, and the resistors may achieve shunt, so as to further solve the problem of difficulty in low-gray-scale display.

During specific implementation, in the display substrate provided in the embodiments of the present disclosure, as shown in FIG. 2, the inventor of the present disclosure knows through electrical simulation that when a resistance value of the resistor R1 is greater than 10 KΩ, a required current magnitude may be reached during low-gray-scale display, such that the resistance value of the resistor R1 is greater than 10 KΩ.

During specific implementation, in the display substrate provided in the embodiments of the present disclosure, as shown in FIG. 1, a width of the gap between the two adjacent pixel islands ranges from 10 μm-30 μm, such that manufacturing of the first switch transistor and the resistor is facilitated on the basis of guaranteeing high PPI.

During specific implementation, in the display substrate provided in the embodiments of the present disclosure, as shown in FIG. 2, the display substrate may further includes: a plurality of gate lines (G1, G2, . . . ), a plurality of data lines (D1, D2, . . . ) and a plurality of detection lines (S1, S2, . . . ) located in each pixel island, each gate line may extend in a first direction, each data line and each detection line may extend in a second direction, and the first direction is crossed with the second direction. As shown in FIG. 2, the first direction may be perpendicular to the second directions.

During specific implementation, in the display substrate provided in the embodiments of the present disclosure, as shown in FIG. 2, the pixel circuit 3 further includes: a second switch transistor T2, a third switch transistor T3, and a capacitor C.

A gate electrode of the second switch transistor T2 is electrically connected to a scanning control end (the scanning control end is correspondingly connected to a scanning line, for example, a gate electrode of a second switch transistor T2 in a first row of subpixels 2 is electrically connected to a scanning line G1, a gate electrode of a second switch transistor T2 in a second row of subpixels 2 is electrically connected to a scanning line G2, and so on), a first electrode of the second switch transistor T2 is electrically connected to a data signal end (the data signal end is correspondingly connected to a data line, for example, a first electrode of a second switch transistor T2 in a first column of subpixels 2 is electrically connected to a data line D1, a first electrode of a second switch transistor T2 in a second column of subpixels 2 is electrically connected to a data line D2, and so on), and a second electrode of the second switch transistor T2 is electrically connected to the gate electrode of the driving transistor DT.

A gate electrode of the third switch transistor T3 is electrically connected to a detection control end S (the detection control end S may be in electrically connected to a gate line dependently and correspondingly, which is not shown in FIG. 2), a first electrode of the third switch transistor T3 is electrically connected to a detection signal end (the detection signal end is correspondingly connected to a detection line, for example, a first electrode of a third switch transistor T3 in the first column of subpixels 2 is electrically connected to a detection line S1, a first electrode of a third switch transistor T3 in the second column of subpixels 2 is electrically connected to a detection line S2, and so on), and a second electrode of the third switch transistor T3 is electrically connected to the anode of the light-emitting device L.

The capacitor C is electrically connected between the gate electrode and the first electrode of the driving transistor DT.

During specific implementation, in the display substrate provided in the embodiments of the present disclosure, as shown in FIG. 2, detection signal ends of one column of subpixels 2 are electrically connected to one sensing line, and detection signal ends of different columns of subpixels 2 are electrically connected to different sensing lines.

During specific implementation, in order to satisfy the requirement for high PPI, the OLED uses a simple pixel circuit driving mode as much as possible to ensure a minimum number of MOS, and the size of the MOS need to be as small as possible. Reduction of the number and the size of the MOS brings a series of problems, for example, a threshold voltage Vth uniformity problem of the MOS, a Vth offset problem caused by fatigue of the MOS, etc. Therefore, in the embodiments of the present disclosure, a 3T1C pixel circuit solution with an external compensation function is used, as shown in FIG. 2, the detection lines (S1, S2, . . . ) may also be configured to be connected to an external compensation circuit (not shown in the figure), and then the detection lines may output collected potentials to the external compensation circuit as detection data, such that the external compensation circuit may flexibly adjust, according to the detection data, potential of a data signal provided by the data line, so as to achieve external compensation of a driving signal output to the light-emitting device L, the situation that the driving signal output to the light-emitting device L is abnormal due to threshold voltage drift of the driving transistor of the pixel circuit is prevented, and a display effect is ensured.

Optionally, the transistor in each subpixel may be a Metal-Oxide-Semiconductor Field-Effect Transistor (MOS) and the light-emitting device may be an electroluminescent (EL) device.

During specific implementation, in the display substrate provided in the embodiments of the present disclosure, as shown in FIG. 1, light colors of light-emitting device in one pixel island (for example, R) are identical. In order to guarantee normal display, the display substrate may be provided with a plurality of pixel islands capable of displaying different colors.

As shown in FIG. 1, the plurality of pixel islands (R, G, B) are distributed in an array, and assuming that the display substrate is displayed with three primary colors (red, green, and blue), the display substrate may have a plurality of first pixel islands R capable of displaying red, a plurality of second pixel islands G capable of displaying green, and a plurality of third pixel islands B capable of displaying blue.

One first pixel island R, one second pixel island G and one third pixel island B may form a pixel group for emitting red light rays, blue light rays and green light rays to achieve color display.

When a certain gate line (for example, the first gate line) G1 provides a gate electrode driving signal, the second switch transistor T2 included in each subpixel 2 in a row of subpixels 2 connected to the gate line G1 is turned on. The data line D1 may output data signals to the gate electrodes of the driving transistors DT connected to the second switch transistors T2 by means of the turned-on second switch transistors T2, so as to turn the driving transistors DT on. The capacitor C may be configured to store the data signal. Moreover, each driving transistor DT may respond to the data signal and a power supply signal provided by the connected first power supply end VDD, and output the driving signal (for example, driving current) to the light-emitting device L connected with the driving transistor DT, so as to drive the light-emitting device L to emit light. The third switch transistor T3 may be turned on when the connected detection control end S provides a control signal, and a detection line S1 connected to the third switch transistor T3 may output a sensing signal to the anode of the light-emitting device L at the moment, so as to achieve noise reduction on the anode of the light-emitting device L. After noise reduction, the driving signal may not be output to the light-emitting device L. In this case, the detection line S1 may collect the potential of the anode of the light-emitting device L and output the potential to the external compensation circuit.

It should be noted that providing a signal may mean providing a signal at an effective potential. Correspondingly, not providing signal means providing a signal at an ineffective potential. When the transistor is an N-type transistor, the effective potential may be a high potential with respect to the ineffective potential, and when the transistor is a P-type transistor, the effective potential may be a low potential with respect to the ineffective potential. In addition, the threshold voltage is referred to as the threshold voltage Vth of the driving transistor DT.

It should be noted that in FIG. 2 of the embodiments of the present disclosure, all of the transistors are N-type transistors, and certainly, all of the transistors may be P-type transistors.

A principle of external compensation for a poor display effect caused by threshold voltage drift is described below in conjunction with the display substrate shown in FIG. 2:

in a compensation stage, a control signal at an effective potential is provided for a detection control end connected to a gate electrode of a third switch transistor T3, the third switch transistor T3 is turned on, and a detection line S1 firstly provides a detection signal for an anode of a light-emitting device L through the third switch transistor T3, such that noise reduction of the anode of the light-emitting device L is achieved, and when a potential of the anode of the light-emitting device L is collected, the light-emitting device L may remain off, that is, it is guaranteed that the potential of the anode and a potential of a cathode of the light-emitting device L are consistent, and no current passes through the light-emitting device L. Then the third switch transistor T3 remains turned-on, and the detection line S1 collects (that is, extracts) a potential (that is, voltage V or current I) of the anode of the light-emitting device L, that is, the second electrode of the driving transistor DT. This process may also be referred to as a detection process of the driving transistor DT. The detection line S1 outputs the collected potential as detection data to an external compensation circuit, such that the external compensation circuit monitors a change and uniformity of the potential (that is, I-V feature) of the driving transistor DT.

Figure 3:
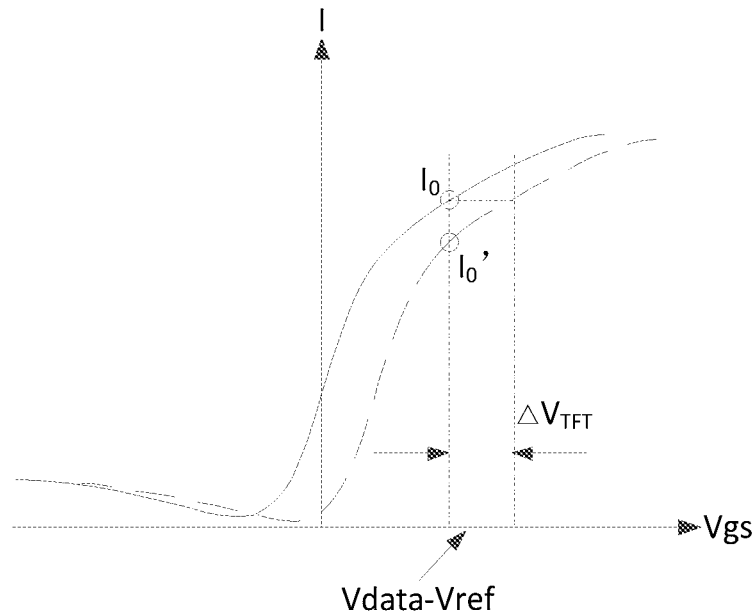
FIG. 3 is a schematic diagram illustrating a potential feature provided in an embodiment of the present disclosure.

As shown in FIG. 3, before the threshold voltage Vth of the driving transistor DT is not drifted, an original I-V curve (solid line as shown in FIG. 3) is shown. In this case, a gate-source potential Vgs of the driving transistor DT generally satisfies: Vgs=Vdata−Vref, where Vdata refers to a potential of the data signal provided by the data line D1 and Vref refers to a potential at the second electrode, that is, the source electrode, of the driving transistor DT, corresponding to the current I being I0. After a period of time, the original I-V curve is changed to an I-V curve shown by a dotted line in FIG. 3 due to the drift of the threshold voltage Vth of the driving transistor DT. In this case, the current I corresponding to Vdata−Vref is changed to I0', which differs from the original I0. In order to achieve compensation, it is guaranteed that I0' is equal to I0, by means of testing, Vgs0 needs to satisfies: Vgs0=Vdata−Vref+ΔVTFT, and VTFT is a compensation amount. After determining the compensation amount, the external compensation circuit may compensate the data signal output by the data line D1 based on the compensation amount.

Figure 4:
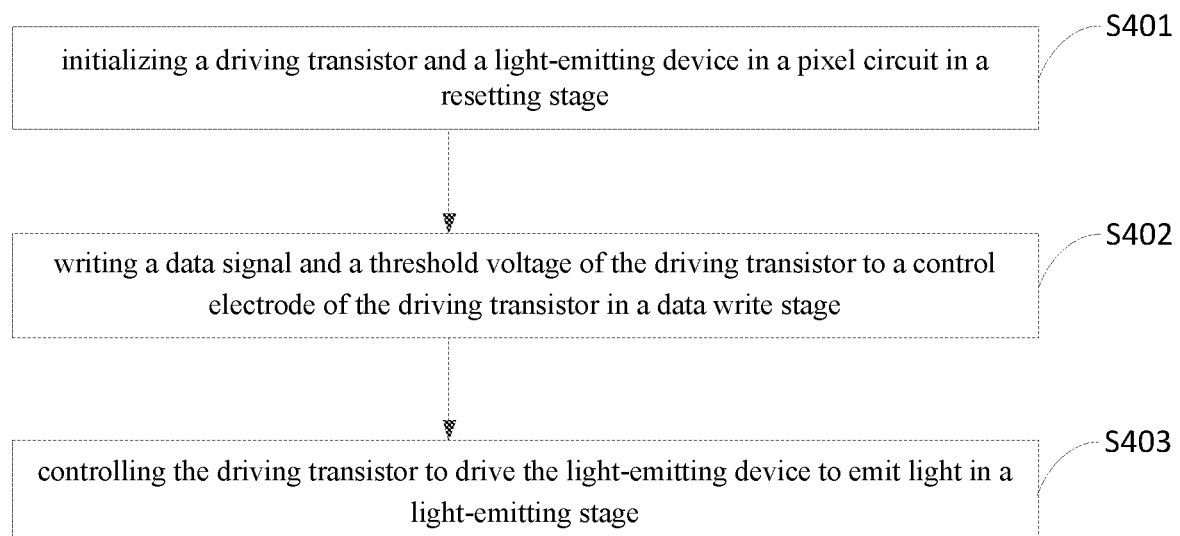
FIG. 4 is a schematic flow of a driving method for a display substrate provided in an embodiment of the present disclosure.

Based on the same inventive concept, the embodiments of the present disclosure further provide a method driving for the above display substrate. As shown in FIG. 4, the driving method may include:

S401, initializing a driving transistor and a light-emitting device in a pixel circuit in a resetting stage.

Figure 5:
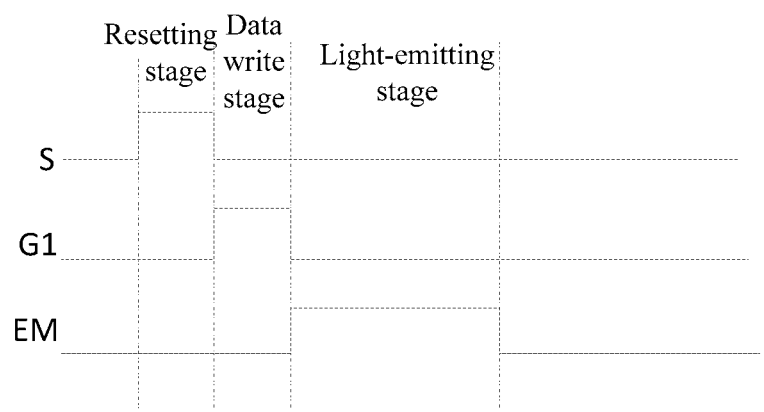
FIG. 5 is a schematic diagram of a operation timing of the display substrate corresponding to FIG. 4.

Accordingly, as shown in FIG. 2, in conjunction with a operation timing in FIG. 5, in the resetting stage, a detection control end S has a high-level signal, a third switch transistor T3 is turned on under control of a low-level signal of the detection control end S, and a detection line S1 connected to the third switch transistor T3 may output a sensing signal to an anode of a light-emitting device L at the moment, so as to initialize a second electrode of a driving transistor DT and the anode of the light-emitting device L.

S402, writing a data signal and a threshold voltage of the driving transistor to a control electrode of the driving transistor in a data write stage.

Accordingly, as shown in FIG. 2, in conjunction with the operation timing in FIG. 5, in the data write stage, when a gate line G1 provides a gate electrode driving signal, a second switch transistor T2 included in each subpixel 2 in a row of subpixels 2 connected to the gate line G1 is turned on. A data line D1 may output data signals to gate electrodes of the driving transistors DT connected to the second switch transistors T2 by means of the turned-on second switch transistors T2, so as to turn on the driving transistors DT to write the data signals and the threshold voltage of the driving transistors DT to control electrodes of the driving transistors DT. The capacitor C may be configured to store the data signal.

S403, controlling the driving transistor to drive the light-emitting device to emit light in a light-emitting stage.

Accordingly, as shown in FIG. 2, in conjunction with the operation timing in FIG. 5, in the light-emitting stage, a high-level signal of the light emission control end EM controls the first switch transistor to be turned on, each driving transistor DT may respond to the data signal and a power supply signal provided by the first power supply end VDD connected with the driving transistor DT, and output the driving signal (for example, driving current) to the connected light-emitting device L, so as to drive the light-emitting device L to emit light.

During specific implementation, in the driving method provided in the embodiments of the present disclosure, as shown in FIG. 2, in the light-emitting stage, when it is determined that a light gray scale of the light-emitting device L is a preset gray scale, for example, the preset gray scale is a low gray scale of 0-50, a voltage of the first power supply end VDD may be fixed as a voltage corresponding to a gray scale 50, and display at different gray scales is achieved by adjusting a duty ratio (turn-on duration) of the first switch transistor T1, so as to solve the problem of difficulty in low-gray-scale display.

Figure 6:
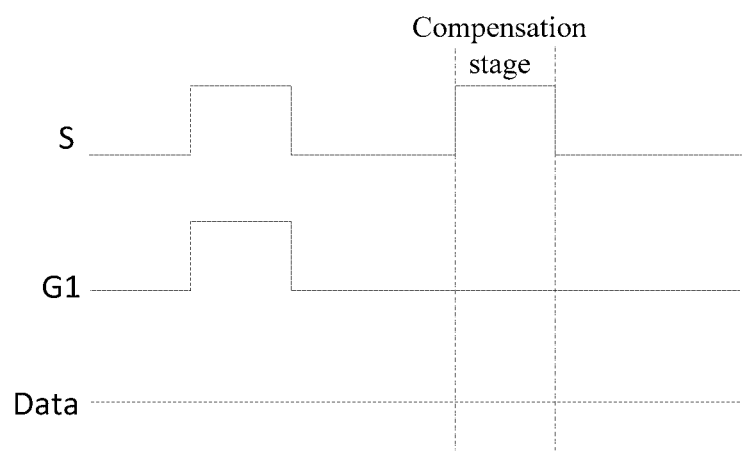
FIG. 6 is a schematic diagram of another operation timing of the display substrate corresponding to FIG. 4.

During specific implementation, in the driving method for the display substrate provided in the embodiments of the present disclosure, as shown in FIG. 6, the driving method further includes a compensation stage, and the content in the display substrate is referred to for a principle of external compensation for a poor display effect caused by threshold voltage drift, which is not detailed here. The compensation stage may achieve compensation before startup or after shutdown.

Based on the same inventive concept, the embodiment of the present disclosure further provides a display device. The display device includes the display substrate provided in the embodiments of the present disclosure. The problem solving principle of the display device is similar to that of the display substrate, such that the implementation of the display device may be referred to the implementation of the display substrate above, which is not repeated herein.

Specifically, the display device may be any product or part with a display function, for example, a tablet personal computer, a television, a display, a notebook computer, a digital photo frame, a navigator, etc. Other essential components of the display device will be understood by those of ordinary skill in the art, and are not described in detail herein, nor are they intended to be limiting of the present disclosure.

According to a display substrate, a driving method therefor, and a display device provided in the embodiments of the present disclosure, a pixel island driving mode is used, such that a silicon-based OLED may be ensured to achieve high PPI; in addition, by additionally arranging a light emission control circuit 4 electrically connected between a first power supply end VDD and a first electrode of the driving transistor DT, when a low-gray-scale picture is displayed, a corresponding maximum VDD voltage in a low gray scale may be fixed, and different low-gray-scale display is achieved by controlling a starting duration (a pulse width modulation (pwm) method) of the light emission control circuit 4, such that the problem that low-gray-scale display is difficult due to small pixel current of the silicon-based OLED may be solved; and moreover, the light emission control circuit 4 added in the present disclosure is arranged at a gap between two adjacent pixel islands, such that an area of an original subpixel is not increased, a larger number of subpixels may be arranged in the pixel islands, which lays a foundation for high PPI. Therefore, the embodiments of the present disclosure may solve the problems of low pixel current and difficulty in low-gray-scale display of an existing silicon-based OLED on the basis of achieving high PPI.

While the preferred embodiments of the present disclosure have been described, additional alterations and modifications to those embodiments may be made by those skilled in the art once the basic inventive concept is apparent to those skilled in the art. Therefore, it is intended that the appended claims is to be interpreted to include the preferred embodiments and all alterations and modifications that fall within the scope of the present disclosure.

It will be apparent to those skilled in the art that various modifications and variations can be made to the embodiments of the present disclosure without departing from the spirit and scope of the embodiments of the present disclosure. Thus, it is intended that the present disclosure cover such modifications and variations which come within the scope of the appended claims and their equivalents, as well.

What is claimed is:

1. A display substrate, comprising:
   a base substrate, provided with a plurality of pixel islands discretely arranged, wherein each of the plurality of pixel islands comprises a plurality of subpixels distributed in an array;
   a plurality of pixel circuits, arranged in the plurality of subpixels respectively, wherein each of the plurality of pixel circuits comprises a driving transistor and a light-emitting device, a first electrode of the driving transistor is electrically connected to a first power supply end, a second electrode of the driving transistor is electrically connected to an anode of the light-emitting device, and a cathode of the light-emitting device is electrically connected to a second power supply end; and
   a plurality of light emission control circuits, each arranged at a gap between two adjacent pixel islands, wherein the light emission control circuit is electrically connected between the first power supply end and the first electrode of the driving transistor.

2. The display substrate according to claim 1, wherein first electrodes of all driving transistors in at least one pixel island are electrically connected to a same light emission control circuit, and first electrodes of driving transistors in different pixel islands are electrically connected to different light emission control circuits.

3. The display substrate according to claim 2, wherein the light emission control circuit comprises a first switch transistor, a gate electrode of the first switch transistor is electrically connected to a light emission control end, a first electrode of the first switch transistor is electrically connected to a first power supply end, and a second electrode of the first switch transistor is electrically connected to the first electrodes of the driving transistors.

4. The display substrate according to claim 1, further comprising a plurality of resistors, each of the plurality of resistors is arranged at a gap between adjacent pixel islands, wherein
   a first end of the resistor is electrically connected to the anode of the light-emitting device, and a second end of the resistor is grounded.

5. The display substrate according to claim 4, wherein anodes of all light-emitting devices in at least one pixel island are electrically connected to one resistor, and anodes of light-emitting devices in different pixel islands are electrically connected to different resistors.

6. The display substrate according to claim 4, wherein a resistance of the resistor is greater than 10 KΩ.

7. The display substrate according to claim 1, wherein a width of the gap between the two adjacent pixel islands ranges from 10 μm to 30 μm.

8. The display substrate according to claim 1, wherein each of the plurality of pixel circuits further comprises: a second switch transistor, a third switch transistor, and a capacitor;
   a gate electrode of the second switch transistor is electrically connected to a scanning control end, a first electrode of the second switch transistor is electrically connected to a data signal end, and a second electrode of the second switch transistor is electrically connected to the gate electrode of the driving transistor;

a gate electrode of the third switch transistor is electrically connected to a detection control end, a first electrode of the third switch transistor is electrically connected to a detection signal end, and a second electrode of the third switch transistor is electrically connected to the anode of the light-emitting device; and the capacitor is electrically connected between the gate electrode and the first electrode of the driving transistor.

9. The display substrate according to claim 1, further comprising a plurality of sensing lines, wherein detection signal ends of one column of subpixels are electrically connected to one sensing line, and detection signal ends of different columns of subpixels are electrically connected to different sensing lines.

10. The display substrate according to claim 1, wherein light colors of light-emitting devices in one pixel island are identical.

11. The display substrate according to claim 1, wherein the plurality of pixel islands are distributed in an array, and the plurality of pixel islands comprise a plurality of first pixel islands for displaying red, a plurality of second pixel islands for displaying green, and a plurality of third pixel islands for displaying blue.

12. A display device, comprising the display substrate according to claim 1.

13. A method for driving the display substrate according to claim 1, comprising:
- initializing a driving transistor and a light-emitting device in the pixel circuit in a resetting stage;
- writing a data signal and a threshold voltage of the driving transistor to a control electrode of the driving transistor in a data write stage; and
- controlling the driving transistor to drive the light-emitting device to emit light in a light-emitting stage.

14. The method according to claim 13, wherein in the light-emitting stage, when it is determined that a light gray scale of the light-emitting device is a preset gray scale, a voltage of the first power supply end is fixed, and display at different gray scales is achieved by adjusting a duty ratio of the first switch transistor.

* * * * *